United States Patent
Peng et al.

(10) Patent No.: US 9,606,145 B2
(45) Date of Patent: Mar. 28, 2017

(54) TEST FIXTURE WITH THERMOELECTRIC COOLER AND SPRING-OPERATED HOLDING PIN

(71) Applicant: Applied Optoelectronics, Inc., Sugar Land, TX (US)

(72) Inventors: Luohan Peng, Cypress, TX (US); Darren Tucker, Houston, TX (US); Justin Lii, Houston, TX (US); David Hendricks, Magnolia, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 199 days.

(21) Appl. No.: 14/452,715

(22) Filed: Aug. 6, 2014

(65) Prior Publication Data

US 2016/0041202 A1 Feb. 11, 2016

(51) Int. Cl.
*G01R 1/44* (2006.01)
*G01R 1/067* (2006.01)

(52) U.S. Cl.
CPC ........... *G01R 1/44* (2013.01); *G01R 1/06722* (2013.01)

(58) Field of Classification Search
CPC .......... G01R 1/44; G01R 19/32; G01R 21/14; G01R 31/2874; G01R 31/2877; G01R 31/2891; H05K 1/0201; H05K 1/0203; H05K 7/20; F25B 21/02; A61B 2018/0237; C08G 2261/55
See application file for complete search history.

(56) References Cited

U.S. PATENT DOCUMENTS 3,724,536 A * 4/1973 Baxter ............... G01R 31/2642
165/185
2008/0252324 A1* 10/2008 Barabi ................. G01R 1/0458
324/750.11

* cited by examiner

*Primary Examiner* — Son Le
(74) *Attorney, Agent, or Firm* — Grossman Tucker Perreault & Pfleger, PLLC; Norman S. Kinsella

(57) ABSTRACT

A test fixture generally includes a thermoelectric cooler (TEC) configured to regulate the temperature of a device under test (DUT). The test fixture may further include a device carrier configured to secure the DUT in a desired position relative to the TEC and a spring-operated pin configured to generate a desired contact pressure between the DUT and the TEC. The desired contact pressure may be selected to achieve a thermal coupling between the DUT and the TEC that maintains the temperature of the DUT at a desired operation level.

18 Claims, 6 Drawing Sheets

TEST FIXTURE WITH THERMOELECTRIC COOLER AND SPRING-OPERATED HOLDING PIN

TECHNICAL FIELD

The present invention relates to test fixtures for electronic/optoelectronic devices, and more particularly, to a test fixture with a thermoelectric cooler (TEC) and a spring-operated holding pin to provide a desired contact pressure between the device under test and the TEC.

BACKGROUND INFORMATION

Testing of electronic or optoelectronic devices or other components often involves thermal control of the device under test (DUT). This is particularly true when the device is a laser and the transmission wavelength of the laser may be dependent on the operating temperature of the laser, thus requiring relatively precise thermal control to obtain accurate test results. Many other types of electrical or electronic components may similarly require thermal control to a desired level of precision for proper testing.

Typically, a test fixture, or portion thereof, is enclosed in an oven or other type of environmental control chamber that attempts to regulate the temperature of the environment to a desired level for operation and testing of the device. An oven or other such device, however, is generally not able to maintain a uniform temperature distribution throughout the environment. In particular, each DUT typically generates heat during operation and may therefore raise the local temperature in the vicinity of the device, creating a varying temperature profile throughout the oven. Additionally, each DUT may draw a different operating current, as compared to another DUT, and therefore run at a different temperature. These varying temperatures may degrade testing results and lower production yields.

BRIEF DESCRIPTION OF THE DRAWINGS

These and other features and advantages will be better understood by reading the following detailed description, taken together with the drawings wherein.

DETAILED DESCRIPTION

A test fixture, consistent with embodiments described herein, provides improved thermal control of a device under test (DUT). The test fixture generally includes a thermoelectric cooler (TEC) configured to regulate the temperature of the DUT. The test fixture may further include a device carrier configured to secure the DUT in a desired position relative to the TEC and a spring-operated pin configured to generate a desired contact pressure between the DUT and the TEC. The desired contact pressure may be selected to achieve a thermal coupling between the DUT and the TEC that maintains the temperature of the DUT at a desired operation level, while avoiding damage to the DUT that might result from excessive pressure.

The DUT may be any type of electrical, electronic or optoelectronic component, the operation of which is sensitive to temperature variation, including a laser or laser diode chip, such as, for example, a laser diode chip incorporated in a mini-coaxial laser.

As used herein, "wavelength" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

Figure 1:
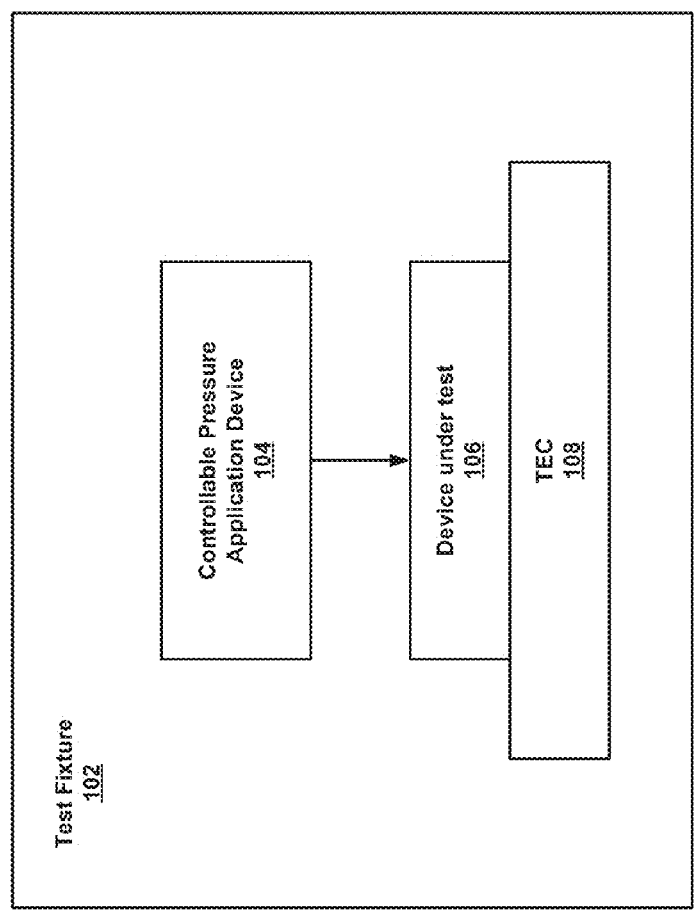
FIG. 1 is a top level system diagram of a test fixture consistent with embodiments of the present disclosure.

Referring to FIG. 1, a test fixture 102 is shown to generally host a DUT 106 which is positioned on, or in relative close proximity, to a temperature control device such as, for example, a thermoelectric cooler (TEC) 108. The TEC is configured to provide heating and/or cooling of the DUT 106 which may directly contact the TEC 108 or may be thermally coupled through another thermally conductive material, such as, for example, a device carrier as will be explained in greater detail below. A controllable pressure application device or system 104 may be configured to regulate the application of pressure to the DUT 106 to more precisely control the thermal coupling between the DUT 106 and the TEC 108 while avoiding potential damage to the DUT that might result from the application of excessive pressure. Although a single DUT 106 is shown for simplicity, it will be appreciated that a test fixture may include accommodation for any number of DUTs. The DUTs may be arranged in an array or other suitable geometric configuration. In some embodiments, controllable pressure application device 104 may be configured to operate on multiple DUTs 106. In some embodiments, multiple pressure application devices 104 may be employed, for example one for each DUT 106.

Figure 2:
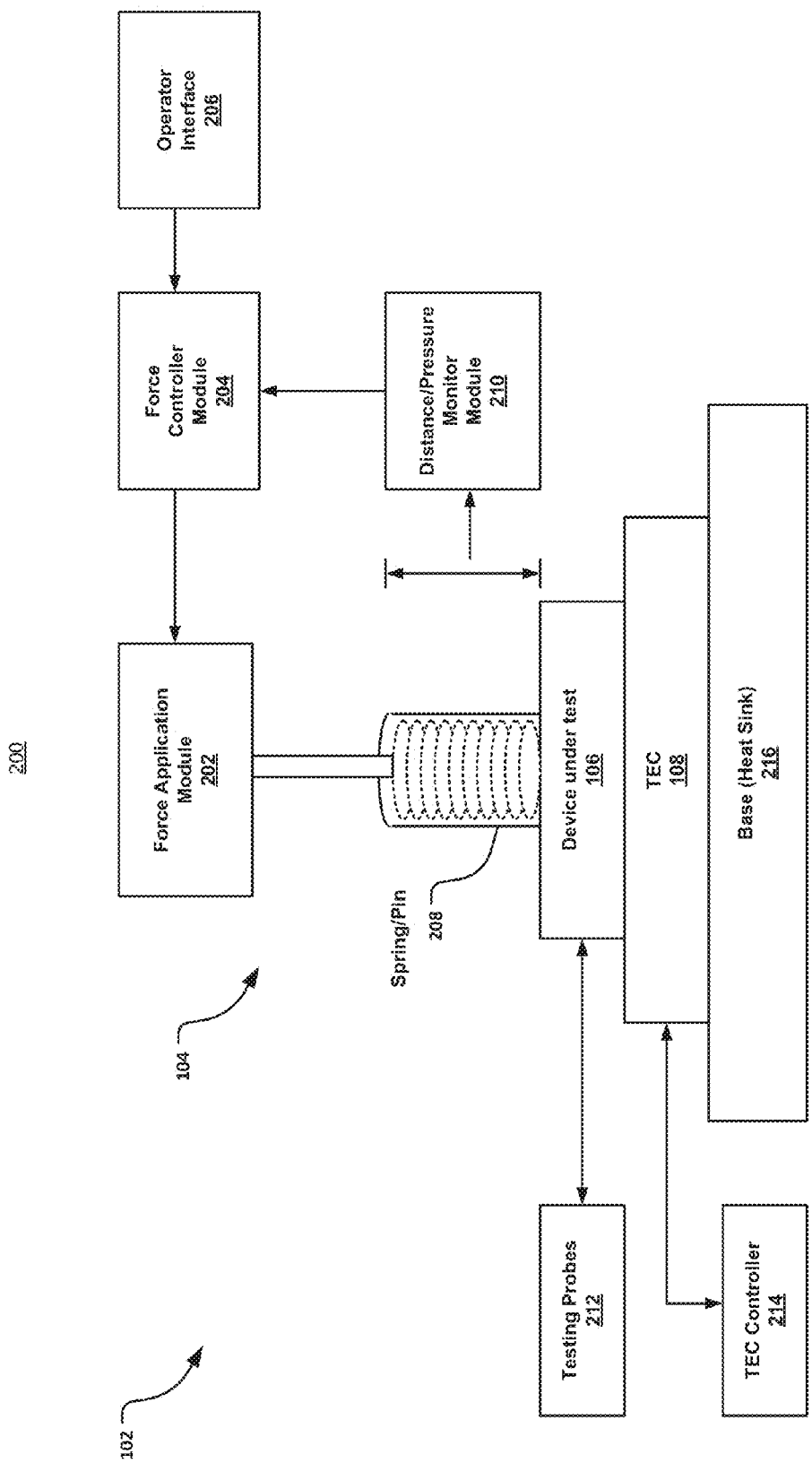
FIG. 2 is a schematic diagram of a test fixture consistent with one embodiment of the present disclosure.

Referring to FIG. 2, a schematic diagram of a test fixture is shown, consistent with one embodiment of the present disclosure. The controllable pressure application device 104 may include one or more of the following components: a spring-operated holding pin 208, a force application module 202, a force controller module 204, a distance/pressure monitor module 210 and an operator interface 206. The test fixture 102 may also include a base or heat sink 216, a TEC controller 214 and testing probes 212.

In a relatively simpler embodiment, the force application module 202 and operator interface 206 may include a lever and/or handle mechanism through which an operator exerts downward pressure on the spring-operated pin 208 which is configured to compress by a pre-determined distance that generates a known spring force. The spring force may be calculated by the spring equation $F=kx$, where k is the spring constant and x is the compression distance. This spring force is selected or calibrated to provide pressure on the DUT that achieves a desired thermal coupling between the DUT and the TEC. The desired contact pressure and resulting thermal coupling may be associated with a desired operational temperature for the DUT. In some embodiments, for example where the DUT is a laser or laser diode, the desired operational temperature may be associated with a desired transmission wavelength (or tuned channel wavelength) of the laser.

In some relatively more complex embodiments, the force application module 202 may be an electric motor, a hydraulic operated device or other suitable device configured to generate force on the spring-operated pin 208 in a more automated manner, as opposed to the manual process described above. Force controller module 204 may be a closed loop feedback system configured to control the level of force generated by module 202 based on, for example, measurements of the compression distance or generated pressure of spring 208 obtained by distance/pressure monitor module 210 or other suitable sensor systems. In some embodiments, force controller module 204 may be implemented as software executing on a computer system or processor and operator interface 206 may include a computer display, keyboard, mouse and/or any other suitable input/output devices coupled to the computer system. For example, a user/operator may enter information about the DUT 106 (e.g., device classification, model number, serial number, etc.) and the computer system may retrieve previously stored data that is related, either directly or indirectly, to the desired force of the spring-operated pin.

TEC controller module 214 may be configured to control the level of cooling/heating that is to be provided to the DUT 106 by the TEC 108. The TEC configuration may be associated with parameters that are pre-determined or operator adjustable. In some embodiments, operator interface 206 or another computer system may be configured to enable operator adjustment of the TEC parameters. Base or heat sink 216 may be configured as both a stable platform for the TEC 108 and as a mechanism for heat dissipation, for example when the TEC is operating to cool the DUT 106.

Testing probes 212 may be configured to supply signals, to monitor and measure results and/or to provide power to the DUT 106 to enable operation of the DUT for testing purposes. In some embodiments, the DUT 106 may be a laser and an optical fiber may also be coupled to the laser during the test. In some embodiments, the DUT may be a mini-coaxial laser.

In some embodiments, a locking mechanism may be provided, for example as part of the operator interface 206, to lock the spring-operated pin 208 in its compressed position during the test so that the correct thermal contact may be maintained throughout the test.

Figure 3:
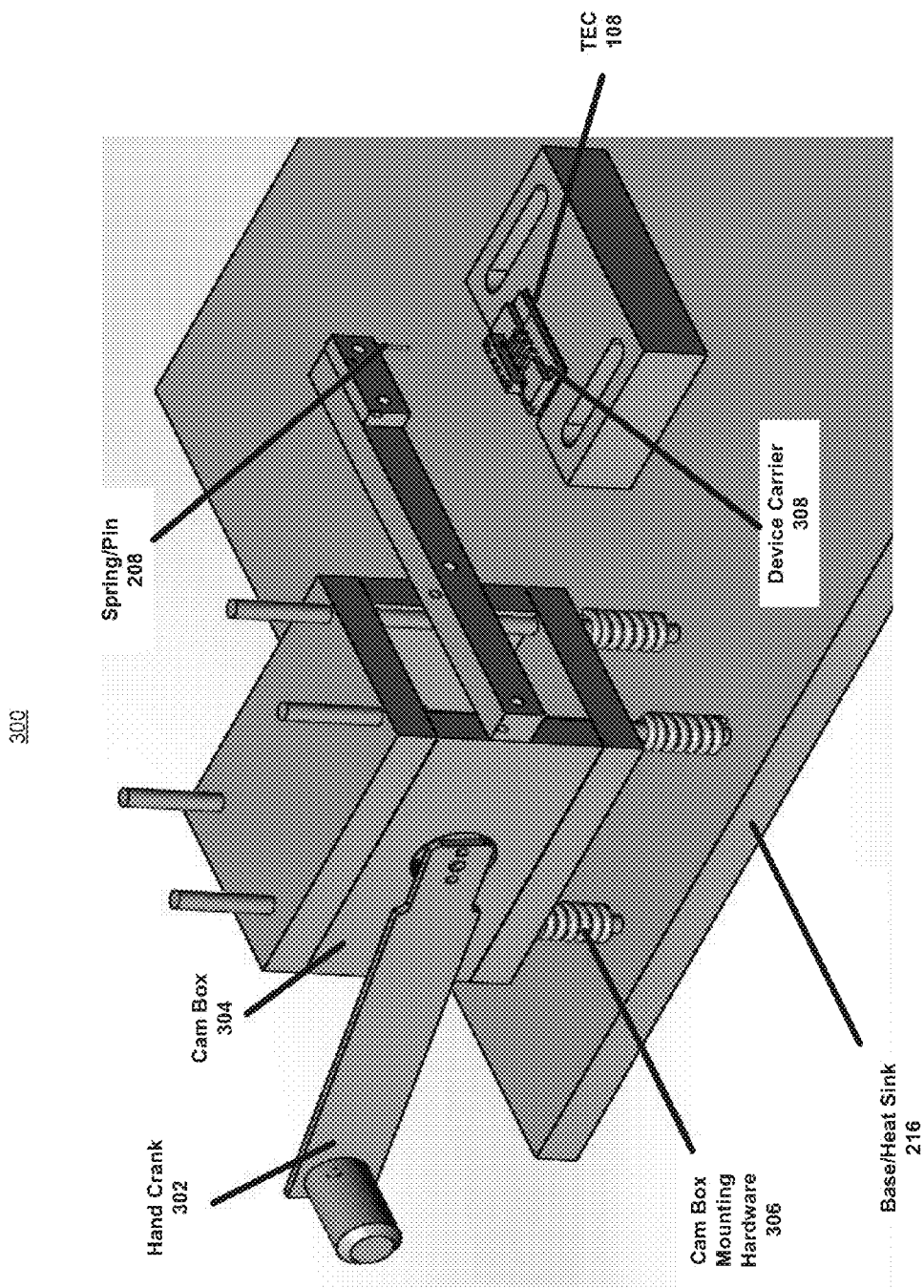
FIG. 3 is a diagram of a test fixture consistent with another embodiment of the present disclosure.

Referring to FIG. 3, a diagram of a test fixture is shown, consistent with another embodiment of the present disclosure. In this embodiment, a heat sink 216 serves as a base for the test fixture 102. The heat sink 216 may be made of aluminum or any other suitable thermally conductive material. A device carrier 308 is shown mounted on the TEC 108. The device carrier 308 may be configured to securely hold the DUT 106 in a desired position relative to the TEC 108, during testing, and will be described in greater detail below. The device carrier 308 may also be made out of aluminum or any other suitable thermally conductive material, and may be machined to conform to the shape of the DUT 106.

In this embodiment, the force application module 202 is implemented as cam box 304, which may be configured to translate rotational or linear motion of hand crank 302, for example by an operator, into downward motion of spring-operated pin 208. The cam box 304 may be secured to the base 216 by any suitable mounting hardware 306. A locking knob, or other locking mechanism (not shown), may be included to engage or fix the position of the cam box 304 during test.

In this illustration, cam box mounting hardware 306 is shown to include springs which are configured to push the cam box 304 back up to effect the separation of spring pin 208 and DUT 106 when the lock is released at the completion of the test. The cam box springs may be configured to avoid excessive pressure contact between spring pin 208 and DUT 106, in order to further reduce the risk of damage to the DUT 106 by the spring pin 208. In some embodiments, the locking knob may be part of the hand crank 302 (or other lever mechanism employed as part of the operator interface 206) or part of the cam box mounting hardware 306.

Figure 4:
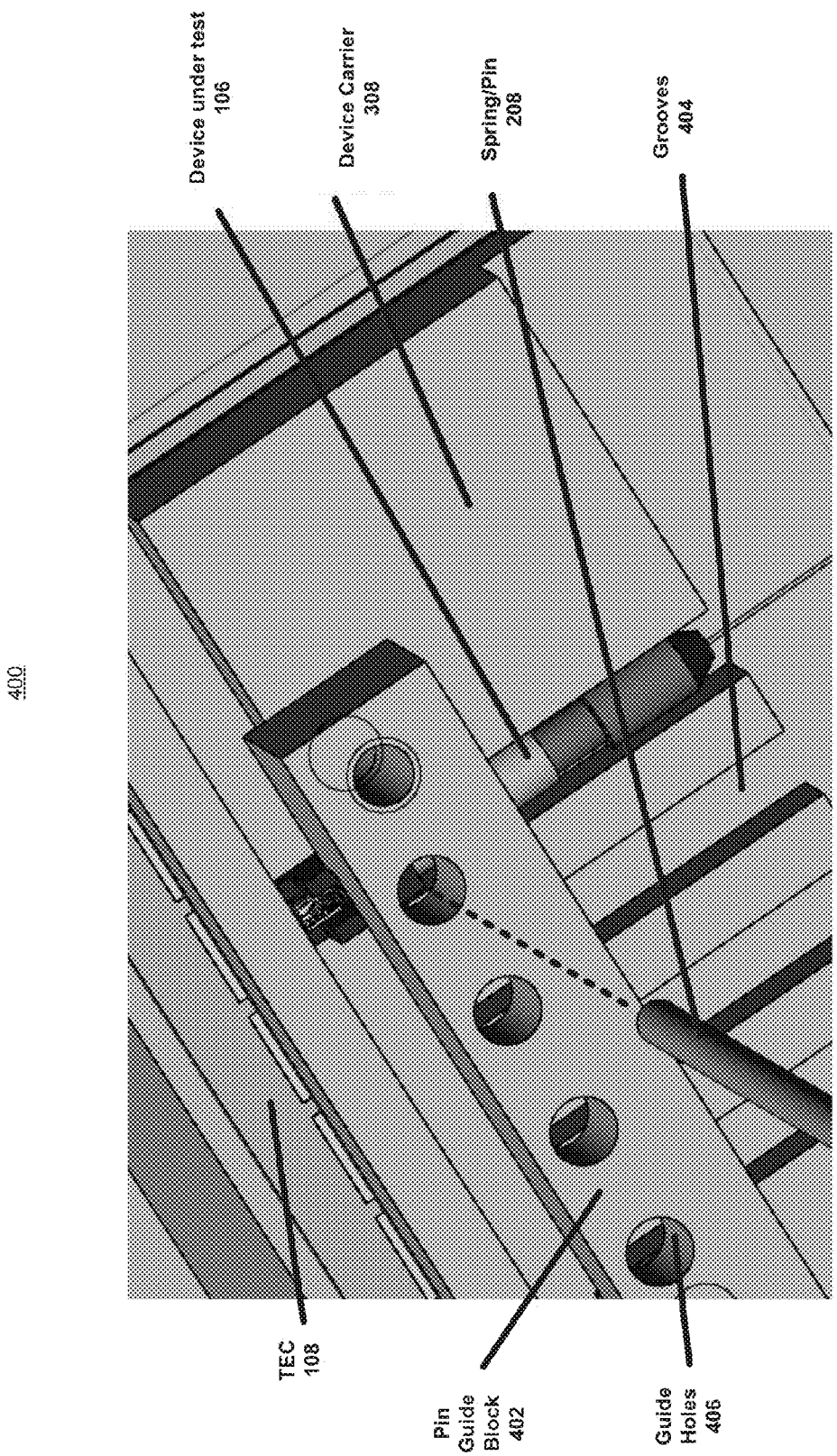
FIG. 4 is a diagram of a portion of a test fixture consistent with another embodiment of the present disclosure.

Referring to FIG. 4, a diagram of a portion of a test fixture is shown, consistent with another embodiment of the present disclosure. In this illustration, device carrier 308 is shown in greater detail. Here, the DUT 106 is a mini-coaxial laser that is secured in one of the grooves 404 that have been machined into the device carrier 308. Pin guide block 402, which is mounted on the surface of the device carrier, may have one or more guide holes 406 machined through it to guide the passage of the spring-operated pin 208 into contact with the DUT 106. The TEC 108 is also shown beneath the device carrier 308. In some embodiments, the device carrier, or a portion thereof, may be interposed between the DU T 106 and the TEC 108. In other embodiments, however, the device carrier may be configured to allow direct contact between at least a portion of the DU T 106 and the TEC 108.

Figure 5:
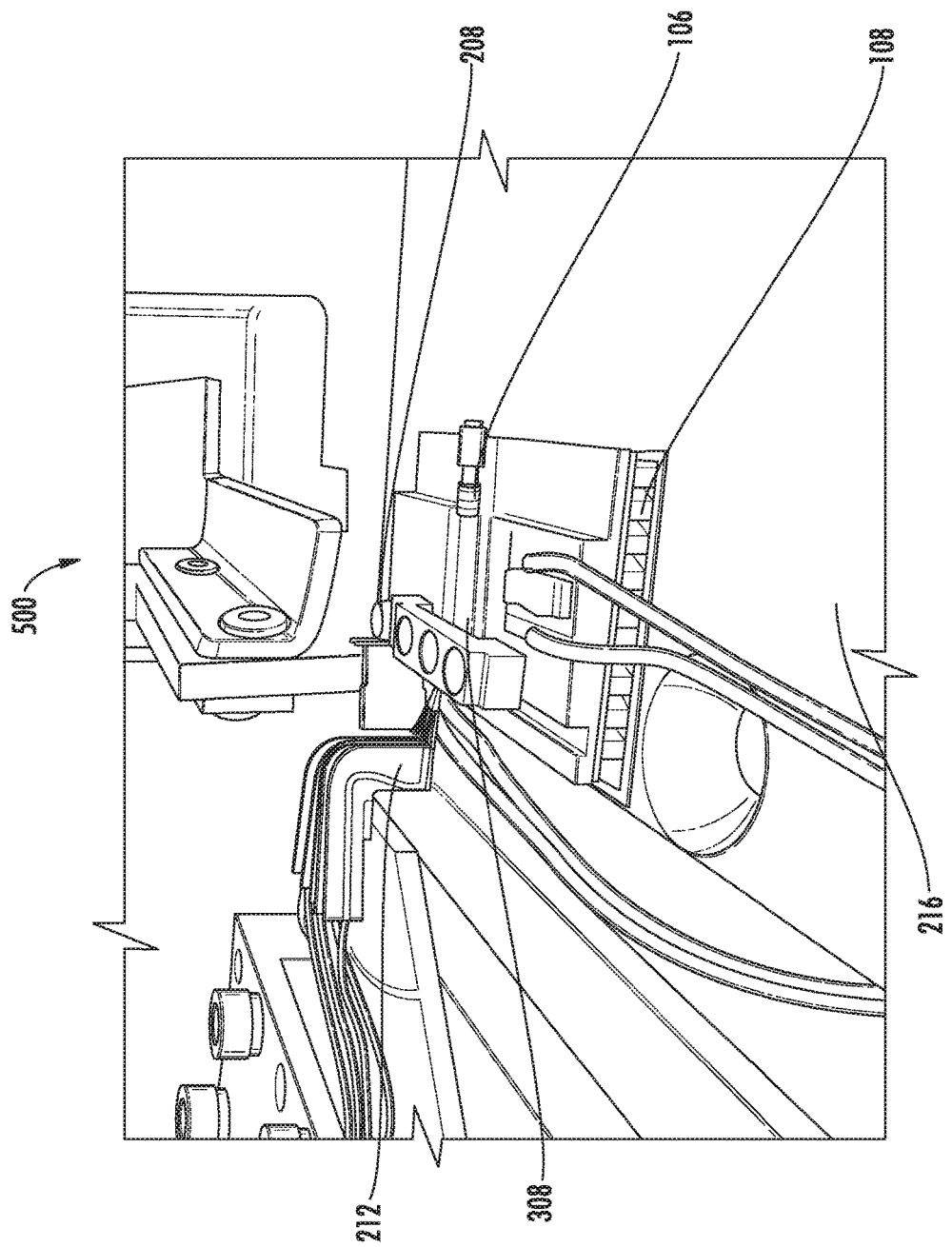
FIG. 5 illustrates a test fixture consistent with another embodiment of the present disclosure.

Referring to FIG. 5, a test fixture consistent with another embodiment of the present disclosure is illustrated. This photograph illustrates the TEC 108 mounted on the base heat sink 216. The device carrier 308 is in turn mounted on the TEC 108. The DUT 106, a mini-coaxial laser, is secured in the device carrier. Testing probes 212 are electrically coupled to the DUT 106, and spring-operated pin 208 is being lowered into the guide hole of the device carrier 308 to provide the desired contact pressure on the DU T 106 to achieve proper thermal coupling between the DUT 106 and the TEC 108.

Figure 6:
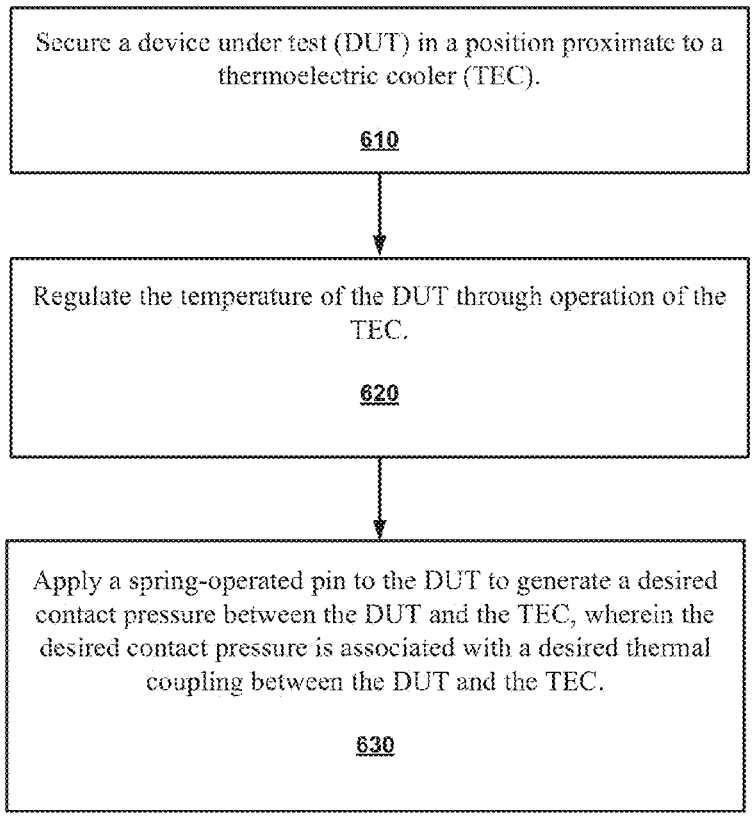
FIG. 6 illustrates a flowchart of operations of one example embodiment consistent with the present disclosure.

FIG. 6 illustrates a flowchart of operations 600 of one example embodiment consistent with the present disclosure. The operations provide a method for generating a desired contact pressure between a device under test and a thermoelectric cooler. At operation 610, the DUT is secured in a position proximate to the TEC. At operation 620, the temperature of the DUT is regulated through operation of the TEC. At operation 630, a spring-operated pin is applied to the DUT to generate a desired contact pressure between the DUT and the TEC. The desired contact pressure is associated with a desired thermal coupling between the DUT and the TEC. The spring-operated pin is calibrated to generate a spring force associated with the desired contact pressure at a threshold spring compression distance and the desired contact pressure is associated with an operational temperature for the DUT.

Accordingly, a test fixture with thermoelectric cooler and spring-operated holding pin, consistent with embodiments described herein, may provide a desired contact pressure between the device under test and the TEC.

Consistent with one embodiment, a test fixture generally includes a thermoelectric cooler (TEC) configured to regulate temperature of a device under test (DUT). The test fixture may also include a device carrier configured to secure the DUT in a desired position relative to the TEC. The test fixture may further include a spring-operated pin configured to generate a desired contact pressure between the DUT and the TEC. The desired contact pressure may be associated with a desired thermal coupling between the DUT and the TEC.

Consistent with another embodiment, a method generally includes securing a device under test (DUT) in a position proximate to a thermoelectric cooler (TEC). The method may also include regulating the temperature of the DUT through operation of the TEC. The method may further include applying a spring-operated pin to the DUT to generate a desired contact pressure between the DUT and the TEC. The desired contact pressure may be associated with a desired thermal coupling between the DUT and the TEC.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A test fixture comprising:
    a thermoelectric cooler (TEC) configured to regulate temperature of a laser diode;
    a device carrier configured to secure said laser diode in a desired position relative to said TEC; and
    a spring-operated pin configured to generate a desired contact pressure between said laser diode and said TEC, wherein said desired contact pressure is associated with a desired thermal coupling between said laser diode and said TEC, and wherein said desired contact pressure is associated with an operational temperature for said laser diode, said operational temperature being associated with a desired transmission wavelength of said laser diode.

2. The test fixture of claim 1, wherein a portion of said device carrier is interposed between said laser diode and said TEC and configured to provide thermal coupling between said laser diode and said TEC.

3. The test fixture of claim 1, wherein said spring-operated pin is calibrated to generate a spring force associated with said desired contact pressure at a threshold spring compression distance.

4. The test fixture of claim 1, wherein said laser diode is packaged as a mini-coaxial laser.

5. The test fixture of claim 1, further comprising a heat sink mounting block, said TEC coupled to said heat sink mounting block.

6. The test fixture of claim 1, further comprising test probes electrically coupled to said laser diode, said test probes configured to operate and monitor said laser diode during a test.

7. The test fixture of claim 1, further comprising a force controller module configured to provide closed-loop control of compression of said spring-operated pin.

8. The test fixture of claim 1, further comprising an operator interface configured to provide operator control over compression of said spring-operated pin during a test.

9. The test fixture of claim 8, wherein said operator interface is further configured to provide a locking mechanism to maintain said compression during said test.

10. The test fixture of claim 9, wherein said operator interface comprises a lever and a locking knob.

11. A method comprising:
    securing a laser diode in a position proximate to a thermoelectric cooler (TEC);
    regulating temperature of said laser diode through operation of said TEC; and
    applying a spring-operated pin to said laser diode to generate a desired contact pressure between said laser diode and said TEC, wherein said desired contact pressure is associated with a desired thermal coupling between said laser diode and said TEC, and wherein said desired contact pressure is associated with an operational temperature for said laser diode, said operational temperature being associated with a desired transmission wavelength of said laser diode.

12. The method of claim 11, further comprising calibrating said spring-operated pin to generate a spring force associated with said desired contact pressure at a threshold spring compression distance.

13. The method of claim 11, wherein said laser diode is packaged as a mini-coaxial laser.

14. The method of claim 11, further comprising coupling a heat sink mounting block, to said TEC.

15. The method of claim 11, further comprising electrically coupling test probes to said laser diode for operation and monitoring of said laser diode during a test.

16. The method of claim 11, further comprising providing closed-loop control of compression of said spring-operated pin.

17. The method of claim 11, further comprising providing an operator interface to control compression of said spring-operated pin during a test.

18. The method of claim 17, wherein said operator interface further provides a locking mechanism to maintain said compression during said test.

* * * * *